United States Patent [19]
Belcher et al.

[11] Patent Number: 5,653,892
[45] Date of Patent: *Aug. 5, 1997

[54] ETCHING OF CERAMIC MATERIALS WITH AN ELEVATED THIN FILM

[75] Inventors: James F. Belcher, Plano; Robert A. Owen, Rowlett, both of Tex.

[73] Assignee: Texas Instruments Incorporated, Dallas, Tex.

[*] Notice: The term of this patent shall not extend beyond the expiration date of Pat. No. 5,466,331.

[21] Appl. No.: 587,260

[22] Filed: Jan. 16, 1996

Related U.S. Application Data

[63] Continuation of Ser. No. 223,073, Apr. 4, 1994, abandoned.
[51] Int. Cl.$^6$ ........................................ B44C 1/22
[52] U.S. Cl. ................... 216/17; 216/52; 216/20; 216/80; 216/65; 216/19; 216/48; 216/49; 216/76
[58] Field of Search ................ 437/3, 5, 18, 974, 437/228 CE, 228 ES, 228 TG, 22.7 R, 227 SEN, 228 OR; 156/664.1, 648.1, 651.1, 659.11, 661.1, 666.1, 633.1; 430/311–320, 322–324; 216/17, 52, 19, 20, 65, 48, 49, 76, 80

[56] References Cited

U.S. PATENT DOCUMENTS

| | | | |
|---|---|---|---|
| 4,080,532 | 3/1978 | Hopper | 250/332 |
| 4,139,444 | 2/1979 | Singer et al. | 156/656 |
| 4,740,700 | 4/1988 | Shaham et al. | 156/623 |
| 4,745,278 | 5/1988 | Hanson | 250/338.2 |
| 4,792,681 | 12/1988 | Hanson | 250/338.2 |
| 4,926,051 | 5/1990 | Turnbull | 437/3 |
| 5,115,442 | 5/1992 | Lee et al. | 437/129 |
| 5,466,331 | 11/1995 | Belcher | 216/19 |
| 5,466,332 | 11/1995 | Owen et al. | 216/19 |

OTHER PUBLICATIONS

D. J. Warner, D. J. Pedder, J. S. Moody, and J. Burrage, "The Preparation and Performance of Reticulated Targets for the Pyroelectric Vidicon", *Ferroelectrics*, 33, 1981, pp. 249–253.

D. J. Warner, et al., "The Preparation and Performance of Reticulated Targets for the pyroelectric vidicon", *Ferroelectrics*, vol. 33, pp. 249–253 (1981).

R. Watton, F. Ainger, S. Porter, D. Pedder and J. Gooding, "Technologies and Performance for Linear and Two Dimensional Pyroelectric Arrays", *SPIE* vol. 510, Infrared Technology X, 1984, pp. 139–149.

T. D. Flaim, G. A. Barner, and T. Brewer, "A Novel Release Layer syster for IC Processing", Brewer Science, Inc. Rolla, Missouri, presented at *KTI IF Conference*, Nov., 1989.

(List continued on next page.)

*Primary Examiner*—Martin Angebranndt
*Attorney, Agent, or Firm*—Brian A. Carlson; James C. Kesterson; Richard L. Donaldson

[57] ABSTRACT

A novel reticulated array comprises islands of ceramic (e.g. BST 40) which are fabricated from novel materials using unique methods of patterning. A front side optical coating (e.g. transparent metal layer 44, transparent organic layer 46 and conductive metallic layer 48) is elevated above the substrate between the ceramic islands. This allows additional material (e.g. polyimide 38) between the optical coating and the substrate above the regions where cavities are to be etched. Etching of the cavities (72) is performed from the back side of the substrate without damaging the front side optical coating. Novel fabrication methods also provide for the convenient electrical and mechanical bonding of each of the massive number of ceramic islands to a signal processor substrate (e.g. Si 80) containing a massive array of sensing circuits.

22 Claims, 3 Drawing Sheets

OTHER PUBLICATIONS

C. Hanson, H. Beratan, R. Owen, and K. Sweetser, "Low–Cost Uncooled Focal Plane Array Technology", Texas Instruments Incorporated, DSEG, presented at *IRIS Specialty Group on Infrared Detectors,* Bedford, MA, Jul. 14, 1993.

C. Hanson, "Uncooled Thermal Imaging at Texas Instruments", SPIE 1993, *International Symposium on Optics, Imaging and Instrumentation, Infrared Technology XIX,* San Diego, Jul. 14, 1993.

H. Kaufman, R. Robinson, W. Hughes, "Characteristics, Capabilities, and Applications of Broad–Beam Sources", *Commonwealth Scientific Corporation,* Alexandria, Virginia, 1987.

R. Watton, "Ferroelectrics for Infrared Detection and Imaging", *ISAF '86, Proceedings of the Sixth IEEE International Symposium on Applications of Ferroelectrics,* Jun., 1986.

ETCHING OF CERAMIC MATERIALS WITH AN ELEVATED THIN FILM

CROSS-REFERENCES TO RELATED APPLICATIONS

This application is a continuation of application Ser. No. 08/223,073, filed Apr. 4, 1994, now abandoned.

The following related applications were filed concurrently with the instant application:

| Title | Inventors | Patent/ Ser. No./ Filing Status |
|---|---|---|
| Dual Etching of Ceramic Materials | Owen, Belcher | 5,466,332 |
| Dual Etching of Ceramic Materials with an Elevated Thin Film | Belcher, Owen | |
| Dual Etching of Ceramic Materials with a Thin Front Film | Belcher, Owen | |
| An Elevated Thin Film for Ceramic Materials | Belcher | 5,466,331 |
| Multiple Level Mask for Patterning of Ceramic Materials | Belcher, Frank, Jones, Long | 18/222, 146, allowed |

FIELD OF INVENTION

This invention generally relates to uncooled infrared (IR) detector arrays and means of fabrication.

BACKGROUND OF INVENTION

The novel IR devices and fabrication processes to be described are related to the types of IR detector arrays recorded in (1) U.S. Pat. No. 4,080,532, Hopper, March 1978; (2) U.S. Pat. No. 4,745,278, Hanson, May 1988; (3) U.S. Pat. No. 4,792,681, Hanson, December 1988; and (4) "LOW-COST UNCOOLED FOCAL PLANE ARRAY TECHNOLOGY", by Hanson, Beratan, Owen and Sweetser, presented Aug. 17, 1993 at the IRIS Detector Specialty Review.

The physical requirements of uncooled arrays and a brief description of current fabrication processes will be presented to aid in the understanding of the improvements realized by the novel methods to be described.

An area imager may contain several hundred to tens of thousand individual picture elements (pixels). Each of these pixels consists of a capacitor (or resistor or another type of electronic element) that has a heat (IR intensity) sensitivity. Making use of the fact that the charge stored by a capacitor is proportional to the product of its terminal voltage and its capacitance, electronic circuitry can be attached to the two terminals of the capacitor based pixel to measure the intensity of the IR impinging on a specific pixel. Obstructions in the imaging field are removed and the electronic connections to these capacitors are simplified if one of the capacitor terminals is made common to all. Hundreds to tens of thousands of connections must still be made between the other isolated terminals of the capacitors and the electronic sensing circuitry. In addition, the pixel capacitors should be thermally isolated from each other while having one terminal connected to all the other common terminals.

The common connection to one side of the pixel capacitors consists of a front side thin film referred to as the optical coating. This may be a composite of a plurality of thin films which have been optimized with regard to IR transparency, IR absorbency, electrical conductivity, thermal resistivity, etc. The thicker heat sensitive dielectric substrate in this case can be barium-strontium-titanate (BST) which is a ceramic perovskite material.

To leave the front side optical coating thin film electrically conducting while isolating the pixels thermally, one may etch deep trenches around the pixel capacitors in the BST substrate. The optical coating side of the device will be referred to as the front side.

SUMMARY OF THE INVENTION

A preferred embodiment of this invention comprises a novel reticulated array of two-terminal heat sensitive capacitors which are fabricated from novel materials using unique methods of patterning.

Ion milling of the BST substrate is preferred over other dry processing etching methods such as reactive ion etching, electron cyclotron resonance plasma etching and standard plasma etching because all would require undesired high temperatures to etch properly.

Ion milling can be used from the back side to isolate pixels. It can be difficult to control this backside ion milling process accurately enough to prevent damage to the optical coating on the front side. Elevating the optical coating on the front side allows additional material between the optical coating and the substrate above the isolation trench. Ion milling the thermal isolation trenches can now be performed from just the back side of the BST substrate without damaging the front side optical coating.

Novel fabrication methods also provide for the convenient electrical and mechanical bonding of each of the massive number of pixel capacitors to an integrated circuit containing a massive array of sensing circuits.

One embodiment of the present invention is a microelectronic structure comprising a substantially undamaged continuous optical coating layer, a reticulated array of ceramic islands disposed on the optical coating layer, and thin electrical contacts disposed on a surface of the ceramic islands opposite the optical coating layer. The optical coating layer comprises elevated portions between and partially overlapping the ceramic islands. The elevated portions of the optical coating layer can provide improved thermal efficiency for sensing impinging infrared radiation. In another embodiment, the ceramic islands comprise a first cross-sectional area proximate the optical coating layer which is larger than a second cross-sectional area proximate the electrical contacts.

A method of forming an embodiment of the present invention comprises providing a ceramic substrate having a front side and a back side, forming an elevation layer having a first predetermined pattern on the front side of the substrate, and depositing a thin front layer on the front side of the substrate and on the elevation layer, thereby forming elevated portions of the thin front layer above the front side. The method further comprises etching a second predetermined pattern into the back side of the substrate, wherein the second predetermined pattern substantially aligned with the elevated portions of the thin front layer on the front side, thereby forming cavities extending down to and partially into the elevation layer, but not extending to the thin front layer. The method further comprises removing the elevation layer, thereby forming isolated islands of the ceramic substrate connected by the thin front layer. The thin front layer remains substantially undamaged, having not been exposed to the etching process forming the second predetermined pattern.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Figure 1:
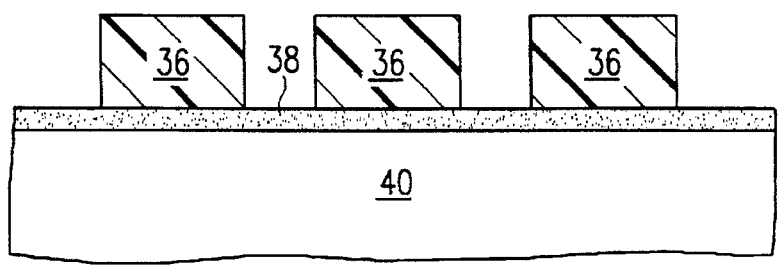
FIG. 1 illustrates the photolithographic steps prior to etching an organic layer on the substrate.

Some of the preferred embodiments will be presented with reference to FIGS. 1–12 and Tables 1 and 2. It should be understood that the drawings are for illustrative purposes and are not to dimensional or relative scale. In addition, only a few detectors are illustrated in the figures, but the present invention can be applied to any number of detectors in various configurations (e.g. single line or array).

These preferred embodiments use ion milling of the BST substrate from the back side. Protection of the front side optical coating is realized by a patterned grid of material between the optical coating and the substrate at the points where the ion milled thermal isolation trenches will appear. After the removal of this additional material, improved thermal isolation of the pixels results.

The optical and electrical coatings are in direct contact with the BST pixel making in a sense a pixel heat sink. Any heat energy in the optical coating flows to the nearest pixel. Even though the optical surface is not planar, the optical imaging is actually superior to a planarized optical coating for some applications. This is due in part to the longer thermal path between pixels along the elevated optical coat. This is also due in part to the ease with which any supporting materials may be completely removed to improve thermal isolation without damage to the optical coating.

Tables 1 and 2, below, provide an overview of some embodiments and the drawings.

TABLE 1

| ID # | Description | Material (dim) | Alternates |
| --- | --- | --- | --- |
| 36 | Etch mask for elevation layer | Photoresist 1.5 μm | 0–5 μm |
| 38 | Organic elevation layer | "PIRL" 12 μm | 0.1–20 μm Photoresist, parylene, polyimide |
| 39 | Protective metal layer | NiCr 1000Å | 500–5000Å Other metals or metal compounds |
| 40 | Substrate | BST 0.06 cm (unthinned) 18 μm (thinned) | 0.01–0.25 cm (unthinned) 1–200 μm (thinned) |
| 42 | Optical coating | 3 layered | 1/4 IR wavelength |
| 44 | Transparent coat | NiCr 50Å | 25–100Å Other metals or metal compounds |
| 46 | 1/4 wavelength separator coat | Parylene 1.4 μm | 1/4 of desired IR wavelength other organics (e.g. photoresist, polyimide, epoxy) |
| 48 | Electrical conducting coat | NiCr 1000Å | 500–2000Å other metals or metal compounds |

TABLE 2

| ID # | Description | Material (dim) | Alternates |
| --- | --- | --- | --- |
| 50 | Backside electrical contact | Bonding Alloys | 4 layer composite of |
| 52 | | In 3 μm | 0.15–6 μm |
| 54 | | Au 0.1 μm | 0.05–0.15 μm |
| 56 | | NiCr 0.05 μm | 0.05–0.15 μm |
| 58 | | TiW 0.05 μm | 0.02–0.10 μm |
| 60 | Adhesive | Wax 0–10 μm | Epoxy |
| 62 | Mechanical carrier | Glass | Silicon, quartz, ceramic |
| 64 | Etch mask for ion milling isolation trenches | Tri-level resist | |
| 66 | | 1.5 μm photoresist | 0.1–2 μm |
| 68 | | 1000Å TiW | 500–1500Å-other metals, SiO$_2$ |
| 70 | | 15 μm photoresist | 0.4–20 μm-polyimide, parylene, epoxy, spin on glass |
| 72 | Isolation trench | | |
| 74 | IC Contact mesa | Polyimide 12 μm | 1–30 μm Photoresist, parylene, epoxy |
| 76 | Ohmic connection | TiW 2000Å | 100–10,000Å other metals, conductors |
| 78 | IC via | | |
| 80 | IC processor | Si or GaAs | |

Rather than show two complete sets of drawings which in most respects serve identical purposes, one process flow will be described before introducing an optional step for another preferred embodiment. In the first process flow, the elevation layer for the optical coating is an organic layer. An alternate process flow introduces a metal layer underneath the organic layer.

Figure 2:
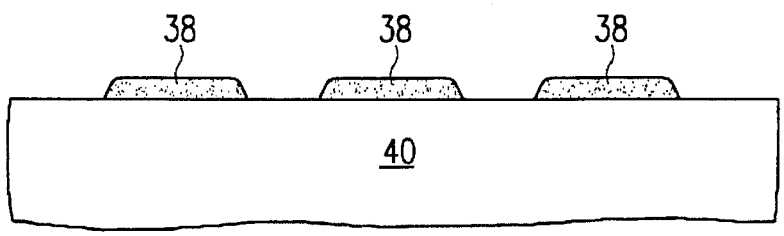
FIG. 2 shows the patterned organic layer.

In FIG. 1 a photoresist layer 36 has been patterned by conventional photolithography over an organic layer 38 which covers the BST substrate 40. Organic layer 38 may be any easily removed material having the desired physical characteristics such as Polyimide Release Layer, "PIRL", a trademark of Brewer Science, Inc., or photoresist. Layer 38 is patterned into a grid over the points on the substrate 40 which will become thermal isolation trenches as shown in FIG. 2. Layer 38 may itself be photodefineable, or it may be patterned using a separate mask layer.

Figure 3:
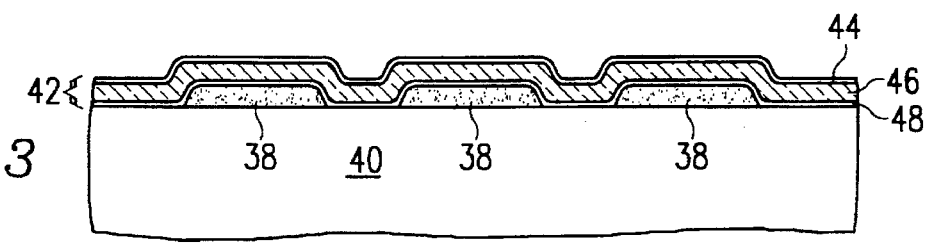
FIG. 3 illustrates (not to scale) the application of the optical coating over the organic grids.

The three layered optical coating 42 is now deposited over the entire front side as illustrated in FIG. 3. From the top toward the substrate 40 the three layers of 42 consist of a semi-transparent thin (50 Å thick) metal 44 such as nichrome (NiCr) over a 1.4 µm thick layer of transparent organic material 46 such as parylene over a 1000 Å thick layer of a conductor 48 such as NiCr. The thickness of layer 46 is designed to make a ¼ wavelength IR filter in conjunction with the surfaces of 44 and 48. Alternate thicknesses and materials are shown in Table 1.

Figure 4:
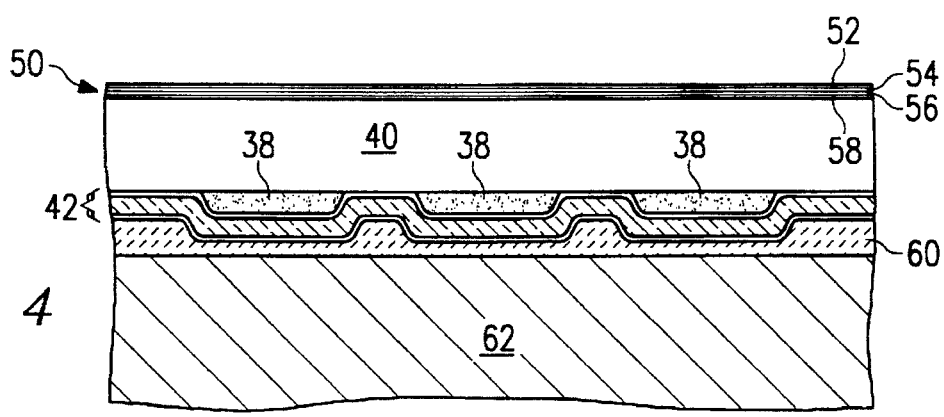
FIG. 4 indicates the mounting of the front side of the substrate to a mechanical carrier, thinning the substrate and applying the metallization alloys to the backside.

As shown in FIG. 4, the front side with the optical coating 42 is mounted to a mechanical carrier 62 with a wax adhesive 60 and the back side of the BST substrate 40 is mechanically polished to the desired thickness (generally 1–200 micrometers and preferably to 18 micrometers). Electrical coating 50 is deposited on the back side. While the composition of 50 is not extremely critical, 50 serves as one side of the pixel capacitor and forms the metallic surfaces to which the complex IC sensing circuits will be mechanically and electrically bonded. The compositions and thicknesses used for 50 are shown in Table 2. From the outside toward the substrate 40 the layers are indium (In) 52, gold (Au) 54, NiCr 56 and TiW 58.

Figure 5:
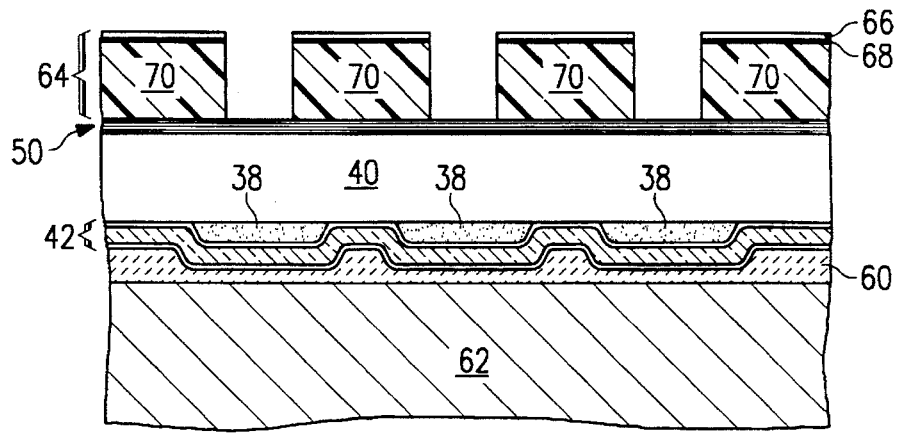
FIG. 5 shows patterned tri-level photoresist over the metals on the back side having the openings aligned with the organic grids on the front side.

In FIG. 5 tri-level resist 64 is patterned such that the openings are above the organic grid 38 on the front side of 40. The tri-level resist consist of a thin layer of photoresist 66 which is used to pattern an underlying layer of TiW 68 over a much thicker photoresist layer 70. These 3 layers form the etch mask to etch the BST substrate 40.

Figure 6:
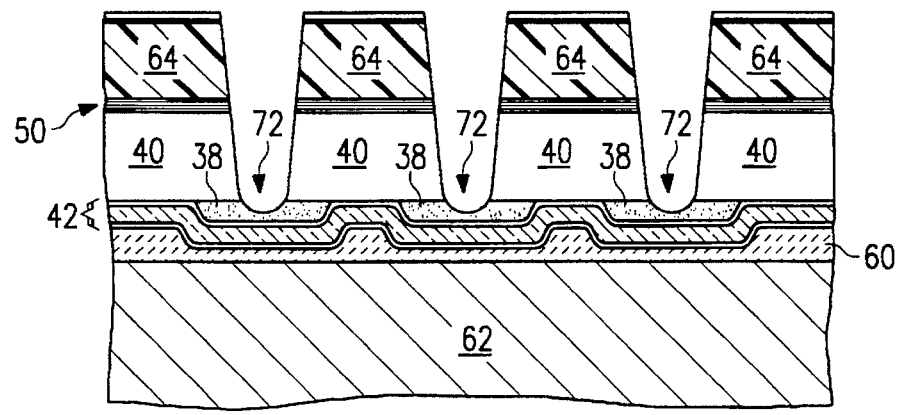
FIG. 6 depicts the ion milled isolation trenches etched down to the front side organic grids.

FIG. 6 shows the thermal isolation trenches 72 which have been ion milled down to the organic grid 38. The grid serves as protection for the optical coating 42. The organic material used for 38 and the tri-level resist 64 are removed with suitable solvents or a dry etch which leave the elevated optical coating 42 undamaged. If 38 is photoresist, conventional solvents and developers may be used. If 49 is "PIRL", proprietary Brewer solvents may be used.

Figure 7:
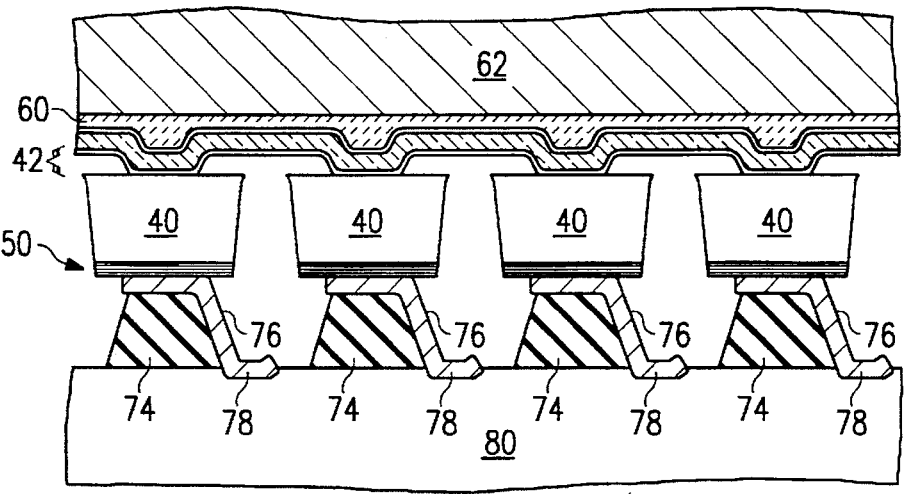
FIG. 7 shows the use of the carrier as a means of supporting the fragile IR sensor array while it is bonded to the planar IC containing the electronic sensing circuitry.

As shown in FIG. 7, the same mechanical carrier 62 is now used to support the fragile IR detector assembly and align the BST 40 mesas with IC mesas 74 such that a bonding material 76 makes electrical connections between each of the pixels by the pixel metallization layer 50 and the processing IC 80 via connection 78.

Figure 8:
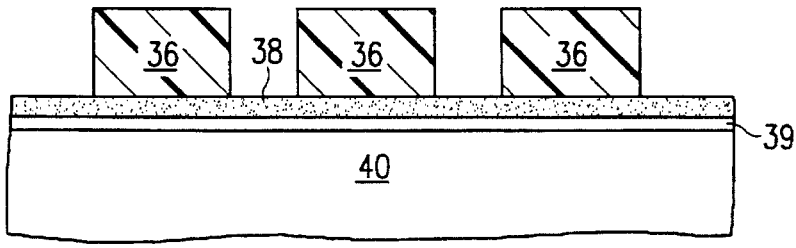
FIG. 8 displays the addition of a metal layer beneath the organic coating on the front side instead of that shown in FIG. 1.

By the described novel methods is produced a unique, rugged reticulated array of IR sensing pixels. Another preferred embodiment will be described with the aid of the previous presentation and FIGS. 8 to 12. FIG. 8 is in all respects identical to FIG. 1 except that a metal layer 39 such as TiW has been deposited before the organic elevation layer 38. This serves to give additional protection during the ion milling operation as well as providing additional electrical conductivity for the common conductor to all the pixel capacitors.

Figure 9:
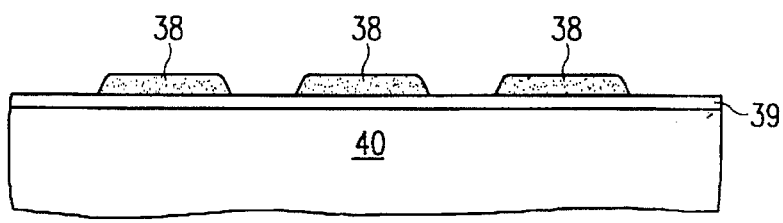
FIG. 9 shows the organic patterning just as in FIG. 2.
Figure 10:
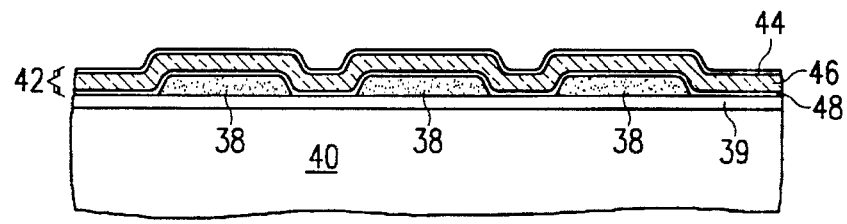
FIG. 10 shows the application of the optical coating as in FIG. 3.

In FIG. 9 it can be seen that although the organic layer 38 is patterned into a grid, layer 39 is not. Alternatively, metal layer 39 may be patterned before, with or after organic layer 38 to facilitate backside alignment. FIG. 10 shows the optical coating 42 deposited over the ensemble as previously described except in this case 42 is in ohmic contact with 39. Metal layer 39 covers the front side of the pixel for a full face contact as shown in FIG. 14. This full face contact can improve the electrical properties for some applications.

Figure 11:
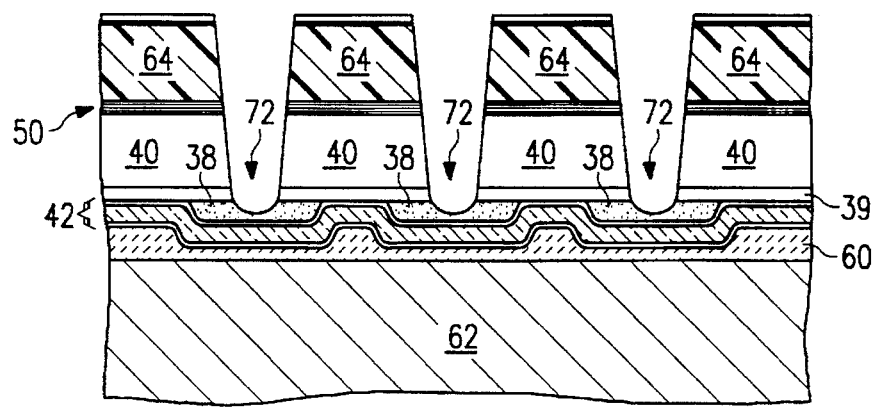
FIG. 11 illustrates the back side ion milling terminated when encountering the elevation layer.

The process flow is identical to that previously described until the ion milling reaches layer 38. Layers 38 and 39 provide a greater separation of the ion milling operation from the optical coating 42 as shown in FIG. 11. The ensemble is now removed from the ion milling machine and placed in a plasma etch environment to preferentially remove the remaining TiW layer 39 that has been exposed by trenches 72. Layer 39 remains over the pixel capacitor areas. The organic grid 38 is now removed as previously described.

Figure 12:
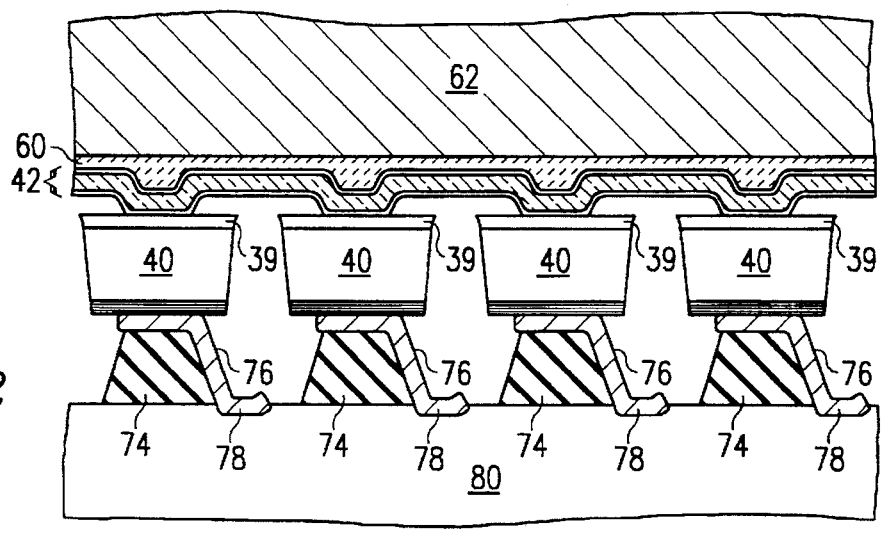
FIG. 12 shows the mounting of the completed IR sensing array to the sensing IC as in FIG. 7.

FIG. 12 shows the bonding of the IR array to its corresponding sensing IC array as has been previously discussed. Metal layer 39 covers the front side of pixel 40 for a full face contact as shown in FIG. 12. This full face contact can improve the electrical properties for some applications.

While this invention has been described with reference to illustrative embodiments, this description is not intended to be construed in a limiting sense. There are many variants and combinations of the materials and dimensions shown in these embodiments partially listed in Table 1 and Table 2. The elevation layer can be many various materials such as but not limited to photoresist, oxide (e.g. $SiO_2$), polyimide, parylene, polyamide, epoxy, nitride (e.g. $Si_3 N_4$), "PIRL", and combinations thereof. Almost any metal can be used for the underlying metal 39. Deposition and removal techniques may vary but the functionality is the same. In the dry removal of materials, reactive ion etching, plasma etching and electron cyclotron resonance plasma etching may often be interchanged without serious effect on the fabrication process. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a reticulated infrared array detector said method comprising steps:

(a) providing a ceramic substrate having a front side and a back side;

(b) forming an elevation layer having a first pattern on said front side of said ceramic substrate;

(c) depositing an optical coating on said front side of said ceramic substrate and on said elevation layer, thereby forming elevated portions of said optical coating above said front side;

(d) forming a backside mask layer on said back side of said ceramic substrate, etching a second pattern into said back side of said ceramic substrate, and removing said backside mask layer, wherein said second pattern is aligned with said elevated portions of said optical coating on said front side, thereby forming cavities extending down to and partially into said elevation layer, but not extending to said optical coating; and (e) removing said elevation layer, thereby forming isolated islands of said ceramic substrate connected by said optical coating, whereby the optical coating has not been exposed to the etching process of step (d).

2. The method according to claim 1, wherein said ceramic substrate is barium strontium titanate.

3. The method according to claim 1, said method further comprising depositing a protective metal layer on said front side of said ceramic substrate before said step of forming said elevation layer.

4. The method according to claim 3, wherein said protective metal layer is patterned to have said first pattern.

5. The method according to claim 3, wherein said protective metal layer is TiW.

6. The method according to claim 1, said step (b) further comprising:

depositing a first organic layer on said front side of said ceramic substrate; forming a first mask layer on said first organic layer;

etching said first organic layer to form said elevation layer having said first pattern; and removing said first mask layer.

7. The method according to claim 6, wherein said first mask layer is photoresist.

8. The method according to claim 1, said step (b) further comprising:

depositing a photodefineable layer on said front side of said ceramic substrate; and photolithographically patterning said photodefineable layer to form said elevation layer having said first pattern.

9. The method according to claim 1, wherein said elevation layer is selected from the group consisting of: photoresist, parylene, and polyimide.

10. The method according to claim 1, wherein said optical coating comprises multiple layers, and said step of depositing said optical coating further comprises:

depositing a conductive metallic layer on said front side of said ceramic substrate and on said elevation layer;

depositing a transparent organic layer on said conductive metallic layer; and depositing a thin transparent metal layer on said transparent organic layer.

11. The method according to claim 10, wherein said conductive metallic layer is NiCr, said transparent organic layer is parylene, and said thin transparent metal layer is NiCr.

12. The method according to claim 1, wherein a top surface of said optical coating opposite said ceramic substrate is mounted to a removable carrier after said step of depositing said optical coating, wherein said carrier provides mechanical support for subsequent process steps.

13. The method according to claim 1, said method further comprising thinning said ceramic substrate by mechanically polishing said back side of said ceramic substrate before said step of etching said second pattern.

14. The method according to claim 13, said method further comprising depositing a thin electrical contact on said back side of said ceramic substrate after said step of thinning said ceramic substrate, and etching said thin electrical contact during said step of etching said second pattern.

15. The method according to claim 14, wherein said islands form infrared sensitive capacitors.

16. The method according to claim 14, wherein said thin electrical contact comprises two or more layers, and comprises indium.

17. The method according to claim 1, wherein said backside mask layer is photoresist.

18. The method according to claim 1, wherein said backside mask layer is a tri-level resist, and said step of forming said backside mask layer further comprises:

forming a thick photoresist layer on said back side of said ceramic substrate;

forming a metal mask layer on said thick photoresist layer;

forming a thin photoresist layer on said metal mask layer;

patterning said thin photoresist layer using photolithography;

patterning said metal mask layer using said thin photoresist layer as a first etch mask; and patterning said thick photoresist layer using said metal mask layer as a second etch mask.

19. The method according to claim 1, wherein said step of etching said second patterns comprises ion milling.

20. The method according to claim 1, wherein said elevation layer is removed with a wet solvent or a dry etch.

21. The method according to claim 1, wherein said islands of said ceramic substrate form a reticulated array.

22. The method according to claim 1, said method further comprising bump bonding said back side of said ceramic substrate to a signal processing substrate after said step of removing said elevation layer.

* * * * *